(12) United States Patent
Weiner

(10) Patent No.: US 9,824,732 B2
(45) Date of Patent: Nov. 21, 2017

(54) MEMORY SYSTEM WITH ENCODING

(71) Applicant: Atmel Corporation, San Jose, CA (US)

(72) Inventor: Albert S. Weiner, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 14/816,478

(22) Filed: Aug. 3, 2015

(65) Prior Publication Data

US 2017/0040043 A1 Feb. 9, 2017

(51) Int. Cl.
*G11C 8/10* (2006.01)
*G11C 8/08* (2006.01)
*G11C 8/12* (2006.01)
*G11C 29/08* (2006.01)
*G11C 7/24* (2006.01)
*G11C 29/52* (2006.01)

(52) U.S. Cl.
CPC .............. *G11C 8/10* (2013.01); *G11C 7/24* (2013.01); *G11C 8/08* (2013.01); *G11C 8/12* (2013.01); *G11C 29/08* (2013.01); *G11C 29/52* (2013.01)

(58) Field of Classification Search
None
See application file for complete search history.

(56) References Cited

U.S. PATENT DOCUMENTS

2007/0002616 A1* 1/2007 Wuidart .................. G11C 7/24
365/185.04

* cited by examiner

*Primary Examiner* — James G Norman
(74) *Attorney, Agent, or Firm* — Fish & Richardson P.C.

(57) ABSTRACT

In an embodiment, a memory system comprises a memory array having memory cells. A decoder is coupled to the memory array and configured to decode input address signals to generate memory cell selection signals. An encoder is configured to generate encoded selection signals based on the memory cell selection signals. In another embodiment, a method comprises: receiving by the decoder of the memory system input address signals, generating, by the decoder, selection signals for selecting a memory cell in the memory array, and generating, by an encoder, encoded selection signals based on the selection signals.

12 Claims, 5 Drawing Sheets

MEMORY SYSTEM WITH ENCODING

TECHNICAL FIELD

This disclosure relates to memory systems and fault detection.

BACKGROUND

Fault injection is a method of attack on secure integrated circuit (IC) chips. There are many forms of fault injection, including power supply excursion, temperature spikes, laser light, logical attack, focused ion beam and microprobing. These methods may be intended to disrupt the normal operation of the secure chip, with the intent of causing the chip to execute incorrectly and allow access to protected contents or to validate an incorrect code.

SUMMARY

In an embodiment, a memory system comprises a memory array having memory cells. A decoder is coupled to the memory array and configured to decode input address signals to generate memory cell selection signals. An encoder is configured to generate encoded selection signals based on the memory cell selection signals. In another embodiment, a method comprises: receiving by the decoder of the memory system input address signals, generating, by the decoder, selection signals for selecting a memory cell in the memory array, and generating, by an encoder, encoded selection signals based on the selection signals. In another embodiment, a microcontroller system comprises: a system bus; a central processing unit (CPU) coupled to the system bus; memory controller or direct memory access (DMA) coupled to the system bus and configured to generate input address signals based on a memory access request received from the system bus and a memory system coupled to the system bus, including a memory array, decoder and encoder. The memory system configured to: receive, by the decoder, input address signals; generate, by the decoder, selection signals for selecting a memory cell in the memory array; and generate, by the encoder, encoded selection signals based on the selection signals.

DETAILED DESCRIPTION

Example System

When attacking a secure device, one possible point of attack is the memory. Memory is easily located from the chip layout and may be implemented to store secure information. Therefore, an attacker could potentially attempt to inject faults into memory, while intending that the data read from a block be altered at a critical time of execution.

Figure 1:
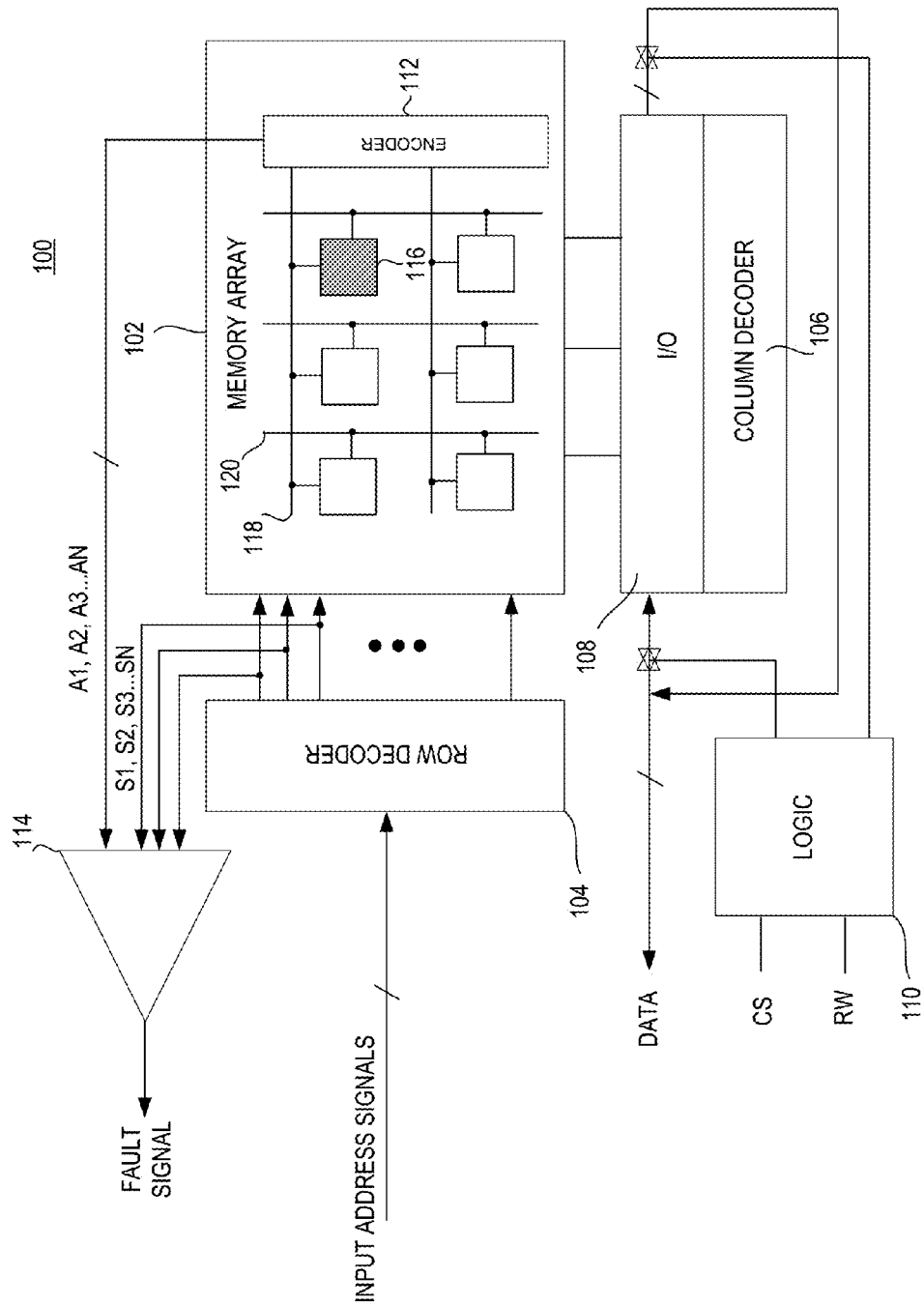
FIG. 1 is a conceptual block diagram of an example memory system with fault detection, according to an embodiment.

FIG. 1 is a conceptual block diagram of an example memory system with fault detection, according to some implementations. System 100 can include memory array 102, row decoder 104, column decoder 106, column input/output (I/O) module 108, logic 110, encoder 112 and fault detector 114. Memory array 102 includes multiple memory cells 116, coupled to word lines 118 and bit lines 120. Memory array 102 can be, for example, EEPROM or RAM.

In operation, input address signals are received by row decoder 104 and column decoder 106. Row decoder 104 and column decoder 106 are configured to reduce the number of input address signals to a smaller number of selection signals $S_1, S_2, S_3 \ldots S_N$, for selecting memory cells 116 from memory array 102. The decoders can select 1 out of N memory cells 116, where $N=2^M$, and M is a positive integer representing a number of input address signals. For example, if N=1024 rows, then M=10. By decoding input address signals, word lines 118 and bit lines 120 are used to select one of memory cells 116 in memory array 102. Row decoder 104 and column decoder 106 each can include logic gates for selecting one of word lines 118 and bit lines 120. Column I/O module 108 includes circuitry (e.g., multiplexers, buffers, sense amplifiers) for reading data from and writing data to selected memory cells 116. The reading and writing of data from and to selected memory cells 116 is controlled by control signals generated by logic 110.

In some implementations, encoder 112 is coupled to the end of each word line 118 (the end opposite the word line (WL) drivers) and generates encoded selection signals $A_1, A_2, A_3 \ldots A_N$. In other implementations, encoder 112 can be integrated in column decoder 106, as described in reference to FIG. 3. Encoder 112 includes logic for generating encoded selection signals A so that they can be compared with the selection signals $S_1, S_2, S_3 \ldots S_N$ output by row decoder 104. Fault detector 114 can include logic for detecting a fault by comparing the selection signals $S_1, S_2, S_3 \ldots S_N$ with the encoded selection signals $A_1, A_2, A_3 \ldots A_N$ to determine if there is a mismatch. If there is a mismatch, a fault signal is generated by fault detector 114.

Figure 2:
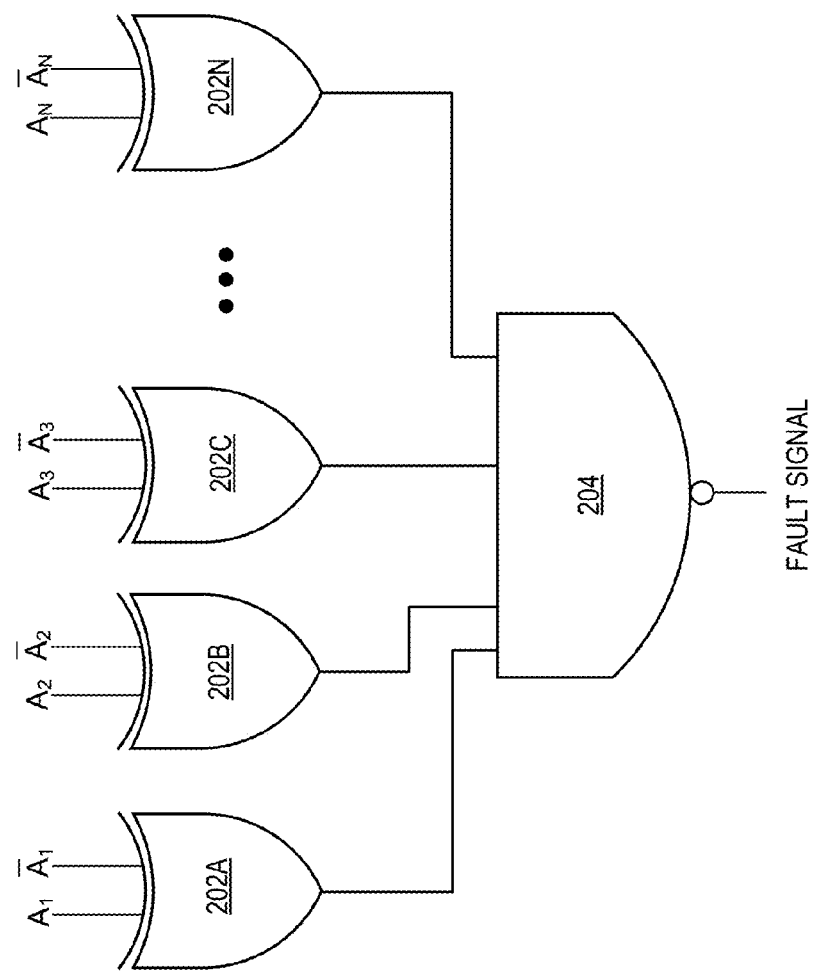
FIG. 2 is a schematic diagram of an example fault detector for detecting faults, according to an embodiment.

FIG. 2 is a schematic diagram of an example fault detector for detecting faults, according to some implementations. As shown in FIG. 1, fault detector 200 can be coupled to the end of word lines 118 in memory array 102, opposite the WL drivers. In other implementations, fault detector 200 can be coupled to the ends of bit lines 120, as shown in FIG. 3.

In some implementations, fault detector 200 can include exclusive-OR (XOR) gates 202A-202N. The inputs of each XOR gate are coupled to an encoded selection signal A and its complement $\overline{A}$. The encoded selection signal A and its compliment $\overline{A}$ can be generated by a wired-OR set of transistors. The outputs of the XOR gates 202A-202N are fed into a wide NAND gate 204. If the logic levels of any (A, $\overline{A}$) pair is the same (e.g., both "0" or both "1"), the output of the XOR gate 202A-202N is low, indicating a fault. If any output of XOR gate 202A-202N is low (indicating a match between the (A, $\overline{A}$) pair then the output of NAND gate 204 will be high, indicating a fault. The logic configuration used in this example fault detector 200 is one possible logic configuration. Other logic configurations can also be used to generate a fault signal.

Figure 3:
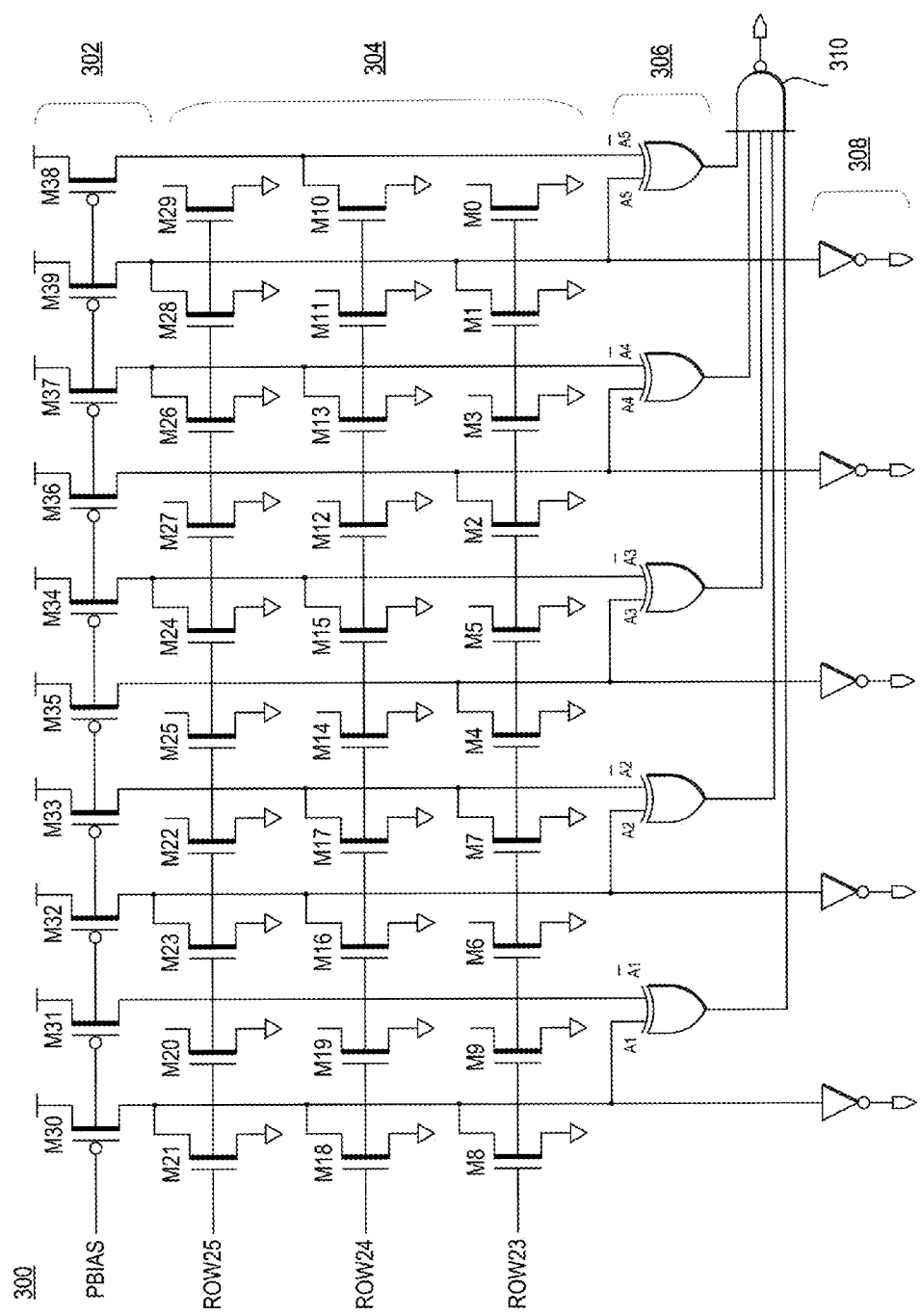
FIG. 3 is a schematic diagram of an example memory array including an encoder and fault detector integrated with column circuitry of a memory array, according to an embodiment.

FIG. 3 is a schematic diagram of an example memory array including an encoder and fault detector integrated with column circuitry of a memory array, according to some implementations. In some implementations, memory array 300 is EEPROM or RAM. The example shown is for a portion of a 32 word line array having four word lines (rows 23-25) and 10 bit lines for generating encoded selection signal pairs (A, $\overline{A}$).

Referring to the top portion 302 of memory array 300 there is a bias line (pbias) coupled to PMOS transistors (e.g., transistors M30-M38), which provides bias voltage to the column circuitry. For ease of understanding, the PMOS transistors can be replaced with resistors. Below the top portion 302 are transistors that may match the memory cell transistors 304 for efficiency of layout (rows 23-25). Each transistor (e.g., transistors M21, M18, M8) is coupled to a row line and sense line. For example, memory cell transistor M21 is coupled to row line 25 and the first sense line (vertical line farthest to the left of array 300). For each sense line there is an adjacent complimentary sense line that includes a wired-OR transistor (e.g., transistors M20, M19, M9) for generating the compliment encoded selection signal $\overline{A}$.

Portion 306 includes XOR gates which have inputs coupled to the sense lines and parallel compliment sense lines to receive encoded selection signal pair (A, $\overline{A}$). The outputs of the XOR gates are coupled to wide NAND gate 310, which generates a fault signal, as described in reference to FIG. 2. The logic gate configuration in portion 306 is one example configuration of fault detection logic. Other logic configurations can also be used to detect and generate a fault signal.

Portion 308 includes a sense amplifier coupled to the end of each bit line to sense the low power signal from the bit line that represents a data bit (1 or 0) stored in a memory cell transistor, and amplify the small voltage swing to recognizable logical levels so the data can be interpreted properly by logic outside memory array 300.

The encoder and fault detector described in the example above was embedded in the memory array. To avoid having a single point of attack, in some implementations the encoded selection signals can be sent to external circuitry outside the memory array for comparison and generation of a fault signal, resulting in two points of attack and a more robust system.

Example Process

Figure 4:
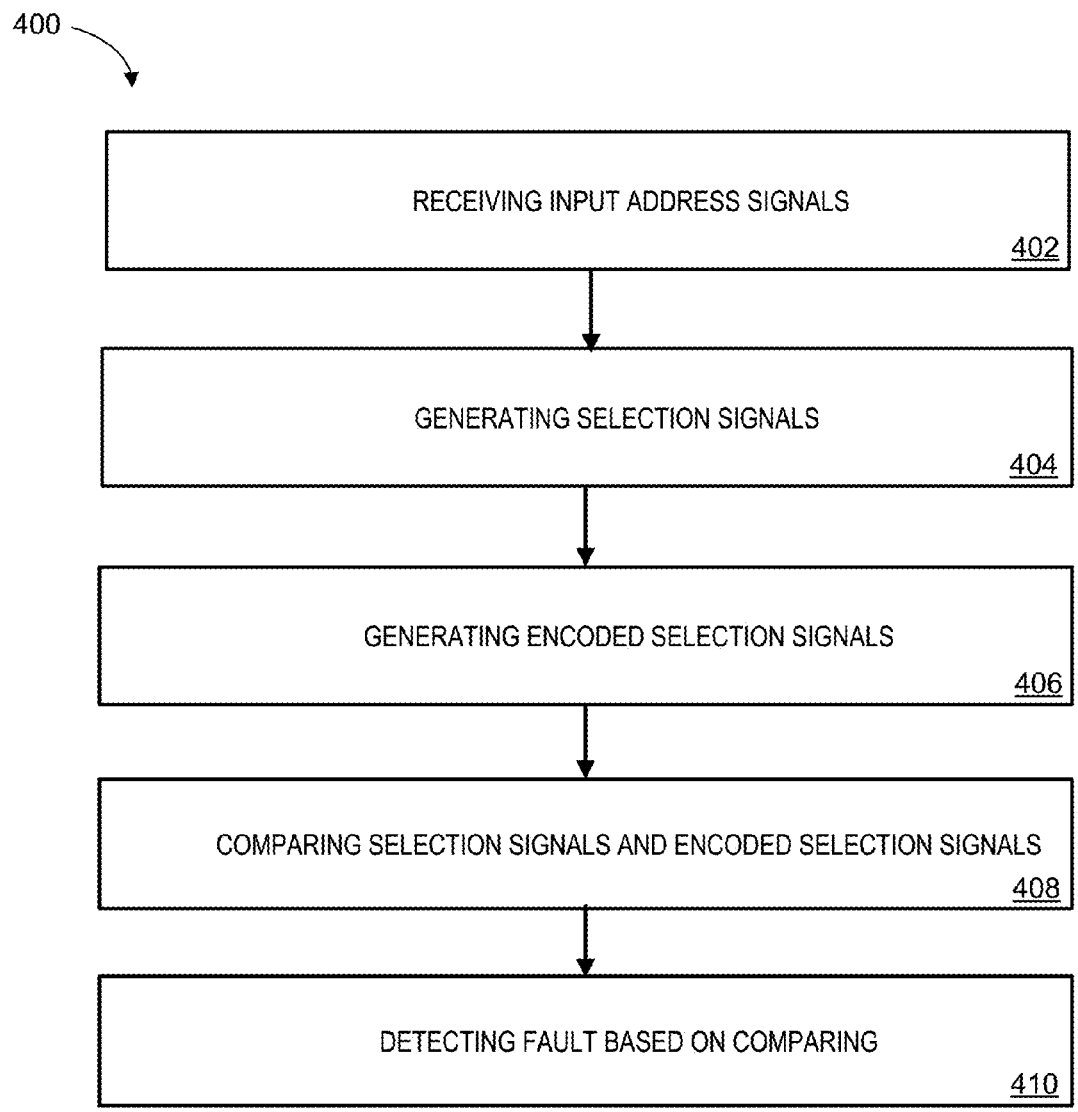
FIG. 4 is a flow diagram of an example process performed by a memory system with fault detection, according to an embodiment.

FIG. 4 is a flow diagram of an example process 400 performed by a memory system with fault detection, according to some implementations.

Process 400 can begin by receiving an input address (402) and generating selection signals (404). The selection signals can be generated by a decoder and are used to select a memory cell in a memory array.

Process 400 can continue by generating encoded selection signals (406). For example, complements of the selection signals can be generated from the selection signals. In some implementations, wired-OR transistors can generate the compliment selection signals.

Process 400 can continue by comparing the selection signals and encoded selection signals (408). For example, the selection signals and the compliment selection signals can be input to XOR gates. If the values of the selection signals and compliment selection signals are the same, the outputs of the XOR gates are low indicating a match.

Process 400 can continue by detecting fault based on the comparing (410). For example, the outputs of all the XOR gates can be input into a wide NAND gate. If any one of the outputs of the XOR gates are low (indicating a match), the NAND gate output is high, indicating a fault.

Figure 5:
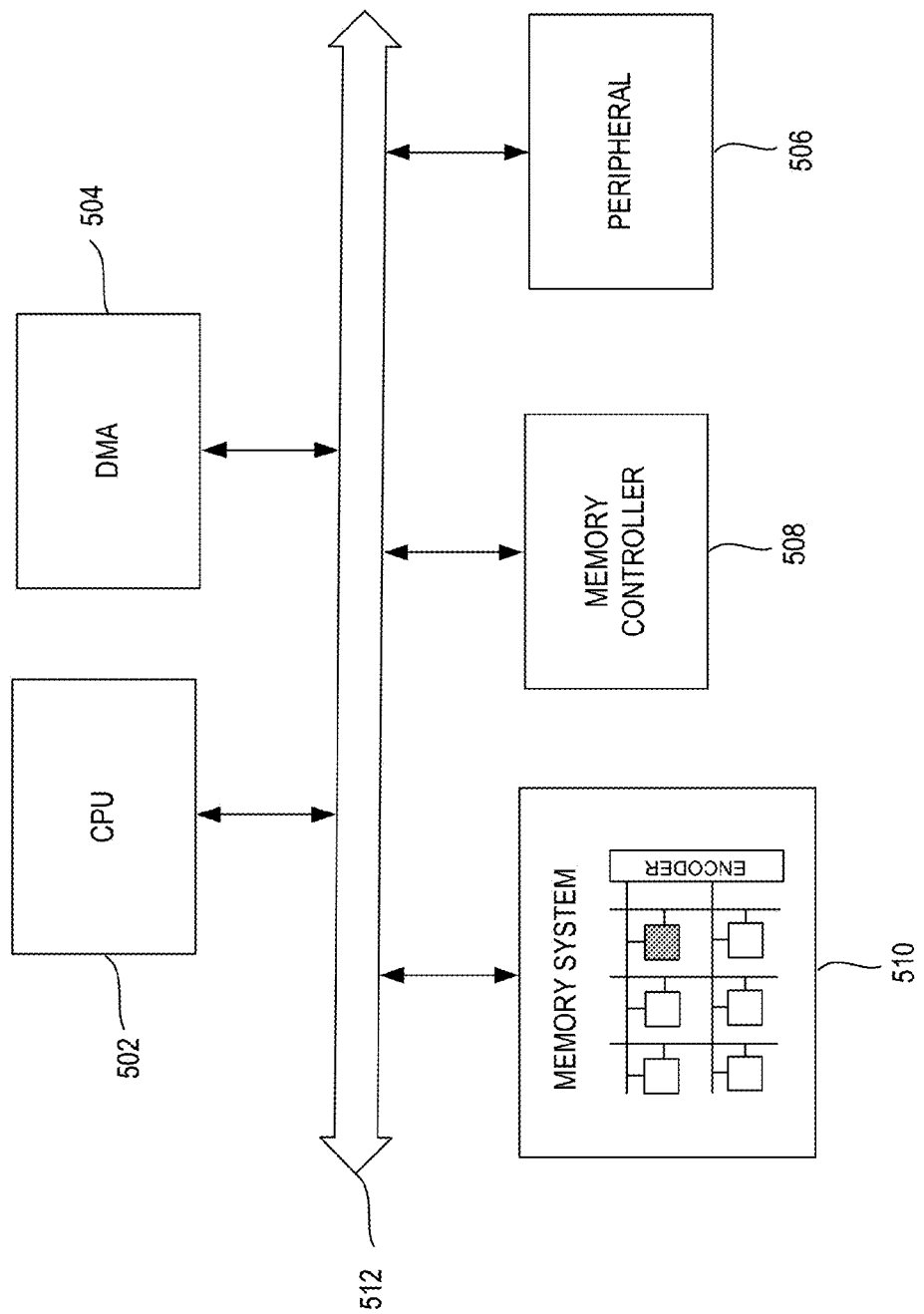
FIG. 5 is a block diagram of an example microcontroller system including a memory system with fault detection, according to an embodiment.

FIG. 5 is a block diagram of an example microcontroller system including a memory system with fault detection, according to some implementations. In some implementations, microcontroller system 500 includes central processing unit (CPU) 502, Direct Memory Access (DMA) 504, peripheral 506, memory controller 508 and memory system 510. Each of these components are coupled to system bus 512. System bus 512 includes a data bus, address bus and control bus. Address signals are placed on the address bus by memory controller 508 and/or DMA 504 to read or write from memory system 510. Memory system 510 includes a memory array and other circuitry and/or logic to perform the processes disclosed in reference to FIGS. 1-4.

While this document contains many specific implementation details, these should not be construed as limitations on the scope of what may be claimed but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A memory system comprising:
   a memory array having memory cells and column circuitry, wherein the column circuitry is configured to read out the memory cells of the memory array;
   a decoder coupled to the memory array, the decoder configured to decode input address signals to generate memory cell selection signals; and
   an encoder incorporated in the memory array and integrated in the column circuitry, the encoder configured to generate encoded selection signals and compliment encoded selection signals from the memory cell selection signals, wherein the encoder includes multiple sense lines, each sense line having a corresponding complimentary sense line, the multiple sense lines configured to generate the encoded selection signals and the complimentary sense lines configured to generate the compliment encoded selection signals.

2. The memory system of claim 1, further comprising:
   a fault detector configured to detect a fault based on the encoded selection signals and compliment encoded selection signals.

3. The memory system of claim 1, further comprising;
   first logic configured to conduct a comparison between the encoded selection signals and the compliment encoded selection signals; and
   second logic configured to detect a fault based on the comparison.

4. The memory system of claim 1, where the decoder includes logic configured to select one of N memory cells in the memory array, where N is a positive integer value, where N=2M, and where M is a positive integer representing a number of input address signals.

5. A method comprising:
   receiving, by a decoder of a memory system having a memory array of memory cells and column circuitry, input address signals, wherein the column circuitry is configured to read out the memory cells of the memory array;

generating, by the decoder, memory cell selection signals for selecting a memory cell in the memory array; and generating, by an encoder incorporated in the memory array and integrated in the column circuitry, encoded selection signals and compliment encoded selection signals from the memory cell selection signals, wherein the encoder includes multiple sense lines, each sense line having a corresponding complimentary sense line, the multiple sense lines configured to generate the encoded selection signals and the complimentary sense lines configured to generate the compliment encoded selection signals.

6. The method of claim 5, further comprising:

detecting, by a fault detector, a fault based on the encoded selection signals and compliment encoded selection signals.

7. The method of claim 5, further comprising;

comparing, by first logic, the encoded selection signals and the compliment encoded selection signals; and detecting, by second logic coupled to output of the first logic, a fault based on the comparing.

8. The method of claim 5, where the decoder is configured to select one of N memory cells in the memory array, where N is a positive integer value, where N=2M, and where M is a positive integer representing a number of input address signals.

9. A microcontroller system comprising:

a system bus;

a central processing unit (CPU) coupled to the system bus;

memory controller or direct memory access (DMA) coupled to the system bus and configured to generate input address signals based on a memory access request received from the system bus;

a memory system coupled to the system bus, including a decoder and a memory array having memory cells, the memory array having memory cells, column circuitry and an encoder incorporated in the memory array and integrated in the column circuitry, the column circuitry configured to read out the memory cells of the memory array, the memory system configured to:

receive, by the decoder, input address signals;

generate, by the decoder, memory cell selection signals for selecting a memory cell in the memory array; and generate, by the encoder, encoded selection signals and a compliment encoded selection signals from the memory cell selection signals, wherein the encoder includes multiple sense lines, each sense line having a corresponding complimentary sense line, the multiple sense lines configured to generate the encoded selection signals and the complimentary sense lines configured to generate the compliment encoded selection signals.

10. The microcontroller system of claim 9, further comprising:

a fault detector configured to detect a fault based on the encoded selection signals and the compliment encoded selection signals.

11. The microcontroller system of claim 9, further comprising;

first logic coupled to the encoded selection signals and the compliment encoded selection signals and configured to conduct a comparison of the encoded selection signals and compliment encoded selection signals; and second logic coupled to output of the first logic and configured to detect a fault based on the comparison.

12. The microcontroller system of claim 9, where the decoder includes logic configured to select one of N memory cells in the memory array, where N is a positive integer value, where N=2M, and where M is a positive integer representing a number of input address signals.

* * * * *

UNITED STATES PATENT AND TRADEMARK OFFICE
CERTIFICATE OF CORRECTION

PATENT NO. : 9,824,732 B2  
APPLICATION NO. : 14/816478  
DATED : November 21, 2017  
INVENTOR(S) : Albert S. Weiner Page 1 of 1

It is certified that error appears in the above-identified patent and that said Letters Patent is hereby corrected as shown below:

In the Specification

Column 2, Line 60, replace "pair" with -- pair) --;

In the Claims

Column 4, Line 63, replace "N=2M," with -- $N=2^M$, --;

Column 5, Line 28, replace "N=2M," with -- $N=2^M$, --; and

Column 6, Line 35, replace "N=2M," with -- $N=2^M$, --.

Signed and Sealed this  
Eighth Day of May, 2018

Andrei Iancu  
*Director of the United States Patent and Trademark Office*